(12) United States Patent
Yuan et al.

(10) Patent No.: US 11,342,386 B2
(45) Date of Patent: May 24, 2022

(54) ARRAY SUBSTRATE AND DISPLAY DEVICE EACH HAVING A DATA LINE CONNECTING SUB-PIXELS OF DIFFERENT COLORS

(71) Applicants: HEFEI BOE JOINT TECHNOLOGY CO., LTD., Hefei (CN); BOE TECHNOLOGY GROUP CO., LTD., Beijing (CN)

(72) Inventors: Can Yuan, Beijing (CN); Yongqian Li, Beijing (CN); Meng Li, Beijing (CN); Zhidong Yuan, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/768,266

(22) PCT Filed: May 27, 2019

(86) PCT No.: PCT/CN2019/088604
§ 371 (c)(1),
(2) Date: May 29, 2020

(87) PCT Pub. No.: WO2020/237470
PCT Pub. Date: Dec. 3, 2020

(65) Prior Publication Data
US 2021/0202601 A1    Jul. 1, 2021

(51) Int. Cl.
*H01L 29/08*     (2006.01)
*H01L 27/32*     (2006.01)

(52) U.S. Cl.
CPC ...... *H01L 27/3218* (2013.01); *H01L 27/3262* (2013.01); *H01L 27/3265* (2013.01); *H01L 27/3276* (2013.01)

(58) Field of Classification Search
CPC ............. H01L 27/3218; H01L 27/3262; H01L 27/3265; H01L 27/3276
See application file for complete search history.

(56) References Cited

U.S. PATENT DOCUMENTS 10,134,772 B2    11/2018  Yang et al.
2008/0117154 A1    5/2008  Yeh
(Continued)

FOREIGN PATENT DOCUMENTS

CN    103257494 A    8/2013
CN    104483794 A    4/2015
(Continued)

*Primary Examiner* — Phuc T Dang
(74) *Attorney, Agent, or Firm* — Dilworth & Barrese, LLP.; Michael J. Musella, Esq.

(57) ABSTRACT

An array substrate and a display device are provided. The array substrate includes at least one data line and a plurality of sub-pixel groups arranged in an array along a first direction and a second direction. At least one sub-pixel group includes two rows of sub-pixels, one row of the two rows of sub-pixels includes a first color sub-pixel and a second color sub-pixel, and the other row of the two rows of sub-pixels includes a third color sub-pixel; the first color sub-pixel, the second color sub-pixel and the third color sub-pixel in each sub-pixel group are connected to a same data line of the at least one data line.

20 Claims, 4 Drawing Sheets

(56) References Cited

U.S. PATENT DOCUMENTS

| | | | | |
|---|---|---|---|---|
| 2014/0292622 A1* | 10/2014 | Lee | ................ | H01L 27/3262 |
| | | | | 345/80 |
| 2016/0037608 A1* | 2/2016 | Ikeda | ................ | H01L 27/3293 |
| | | | | 362/235 |
| 2018/0175123 A1 | 6/2018 | Yoon et al. | | |
| 2020/0006444 A1* | 1/2020 | Li | ................ | H01L 27/3218 |
| 2020/0111849 A1* | 4/2020 | He | ................ | G02F 1/133514 |

FOREIGN PATENT DOCUMENTS

| | | | |
|---|---|---|---|
| CN | 104992957 A | 10/2015 |
| CN | 109188805 A | 1/2019 |
| CN | 109698225 A | 4/2019 |
| KR | 20100025861 A | 3/2010 |

\* cited by examiner

ARRAY SUBSTRATE AND DISPLAY DEVICE EACH HAVING A DATA LINE CONNECTING SUB-PIXELS OF DIFFERENT COLORS

TECHNICAL FIELD

At least one embodiment of the present disclosure relates to an array substrate and a display device.

BACKGROUND

The organic light emitting display (OLED) device is a kind of self-luminous device with a series of advantages such as high brightness, full viewing angle, fast response speed and flexible display, etc. The organic light emitting diode display devices can be divided into PMOLED (passive matrix OLED) and AMOLED (active matrix OLED) according to the driving mode. AMOLED display devices have higher luminous efficiency and can be used as high-resolution large-size display devices.

SUMMARY

At least one embodiment of the present disclosure provides an array substrate and a display device. The array substrate includes a plurality of sub-pixel groups arranged in an array along a first direction and a second direction and at least one data line. At least one of the plurality of sub-pixel groups includes two rows of sub-pixels arranged along the second direction, one row of the two rows of sub-pixels includes a first color sub-pixel and a second color sub-pixel, and the other row of the two rows of sub-pixels includes a third color sub-pixel. The first color sub-pixel, the second color sub-pixel and the third color sub-pixel in each of the plurality of sub-pixel groups are connected to a same date line of the at least one data line.

For example, a first portion of the data line extending along the second direction passes through a gap between the first color sub-pixel and the second color sub-pixel which are connected to the first portion of the data line in the sub-pixel group, and a second portion of the data line bypasses an edge of the third color sub-pixel from a first side of the third color sub-pixel to a second side of the third color sub-pixel, the first side and the second side are respectively located on both sides of a center line of the third color sub-pixel extending along the first direction.

For example, the array substrate further includes: at least one gate line group, including a first gate line, a second gate line and a third gate line extending along the first direction. In each of the plurality of sub-pixel groups, the first color sub-pixel is connected to the first gate line, the second color sub-pixel is connected to the second gate line, and the third color sub-pixel is connected to the third gate line.

For example, the first gate line and the second gate line are respectively located on both sides of a center line of the first color sub-pixel extending along the first direction.

For example, the array substrate further includes a sensing line extending along the second direction and located between adjacent ones of the plurality of sub-pixel groups. The sensing line is connected to the first color sub-pixel and the third color sub-pixel of the sub-pixel group on one side of the sensing line and is connected to the second color sub-pixel of the sub-pixel group on the other side of the sensing line.

For example, each of the sub-pixels further includes a pixel circuit, the pixel circuit is configured to drive each of the sub-pixels, the pixel circuit includes a first thin film transistor, a second thin film transistor, a driving transistor, a storage capacitor and a light emitting element, a gate electrode of the first thin film transistor and a gate electrode of the second thin film transistor are connected to a same gate line, a first electrode of the first thin film transistor is connected to the data line, a first electrode of the second thin film transistor is connected to the sensing line, and a second electrode of the second thin film transistor is connected to an anode of the light emitting element; a gate electrode of the driving transistor is connected to a second electrode of the first thin film transistor, and a second electrode of the driving transistor is connected to the anode of the light emitting element; a first electrode of the storage capacitor is connected to the gate electrode of the driving transistor, and a second electrode of the storage capacitor is connected to the second electrode of the driving transistor.

For example, the array substrate further includes an auxiliary electrode extending along the second direction. The auxiliary electrode is electrically connected to a cathode of the light emitting element, and the light emitting element is a top-emitting organic light emitting diode.

For example, the array substrate includes a plurality of auxiliary electrodes, and at least one column of the plurality of sub-pixel groups is included between adjacent ones of the plurality of auxiliary electrodes.

For example, the array substrate further includes a plurality of power lines extending along the second direction. Each of the plurality of power lines is located between adjacent ones of the plurality of sub-pixel groups, each of the plurality of sub-pixel groups corresponds to one power line, and each of the plurality of sub-pixel groups corresponds to one power line, and each of the plurality of power lines is connected to a first electrode of the driving transistor included in each of the sub-pixels in the corresponding sub-pixel groups.

For example, in a gap between an N-th sub-pixel group and a (N+1)-th sub-pixel group arranged along the first direction, the power line is located on a side of the sensing line away from the first color sub-pixel and the third color sub-pixel connected to the sensing line, and N is a positive integer greater than 0.

For example, in at least one of the plurality of sub-pixel groups, an orthographic projection of a gap between the first color sub-pixel and the second color sub-pixel on a line along the first direction overlaps with an orthographic projection of the third color sub-pixel on the line along the first direction.

For example, in the first direction, a size of the third color sub-pixel is greater than a sum of a size of the first color sub-pixel and a size of the second color sub-pixel in each of the plurality of sub-pixel groups.

For example, in the first direction, a sum of the size of the first color sub-pixel, the size of the second color sub-pixel, and a size of a gap between the first color sub-pixel and the second color sub-pixel is substantially equal to the size of the third color sub-pixel in each of the plurality of sub-pixel groups, and a distance between a center of the third color sub-pixel and a center of the first color sub-pixel is the same as a distance between the center of the third color sub-pixel and a center of the second color sub-pixel.

For example, the first color sub-pixel and the second color sub-pixel have substantially the same shape and size.

For example, the first color sub-pixel and the second color sub-pixel are a red sub-pixel and a green sub-pixel, respectively, and the third color sub-pixel is a blue sub-pixel.

For example, the plurality of sub-pixel groups include a first sub-pixel group and a second sub-pixel group which are alternately arranged along the first direction, and an arrangement order of a row in which the first color sub-pixel and the second color sub-pixel are located and a row in which the third color sub-pixel is located along the second direction in the first pixel group is opposite to an arrangement order of a row in which the first color sub-pixel and the second color sub-pixel are located and a row in which the third color sub-pixel is located along the second direction in the second pixel group.

For example, each color sub-pixel in each of the plurality of sub-pixel groups has the same shape and size, and the first color sub-pixel, the second color sub-pixel and the third color sub-pixel are a red sub-pixel, a green sub-pixel and a blue sub-pixel, respectively.

At least one embodiment of the present disclosure provides a display device, which includes any one array substrate described above.

For example, a resolution of the display device is 8 k.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects.

In research, the inventors of the present application have found that: organic light emitting diode display devices having characteristics of high resolution and high quality, such as display devices with a resolution of 8 k, have problems of increased cost and the like result from factors, such as the limitation of the space of the pixel layout and the increase in the number of data signal lines, etc., in the design process.

The embodiments of the present disclosure provide an array substrate and a display device. The array substrate includes at least one data line and a plurality of sub-pixel groups arranged in an array along a first direction and a second direction. Each sub-pixel group includes two rows of sub-pixels arranged in the second direction, one row of the two rows of sub-pixels includes a first color sub-pixel and a second color sub-pixel, and the other row of the two rows of sub-pixels includes a third color sub-pixel; the first color sub-pixel, the second color sub-pixel and the third color sub-pixel in each sub-pixel group are connected to a same data line of the at least one data line. The array substrate in the embodiments of the present disclosure reduces the number of data lines and saves the space of the pixel layout, thereby not only reducing the design cost, but also reducing the bonding difficulty and further improving the bonding yield.

The array substrate and the display device provided by the embodiments of the present disclosure will be described below with reference to the accompanying drawings.

Figure 1A:
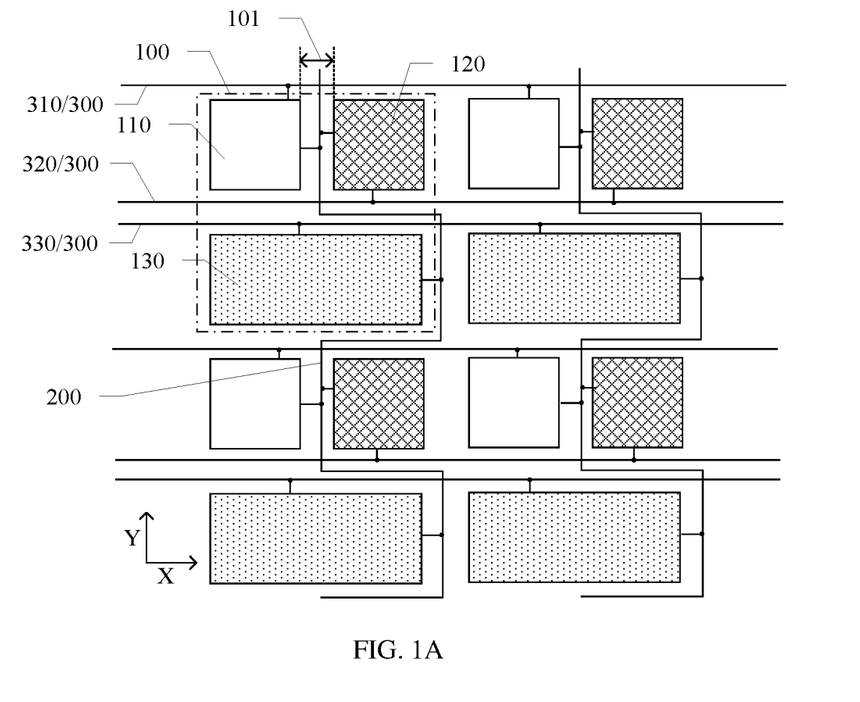
FIG. 1A is a partial structural diagram of an array substrate according to an embodiment of the present disclosure.

FIG. 1A is a partial structural diagram of an array substrate according to an embodiment of the present disclosure. As shown in FIG. 1A, the array substrate includes a plurality of sub-pixel groups 100 arrayed along a first direction (X direction as shown in FIG. 1A) and a second direction (Y direction as shown in FIG. 1A). An embodiment of the present disclosure takes that the first direction is a row direction and the second direction is a column direction as an example, but is not limited thereto. Each sub-pixel group 100 includes two rows of sub-pixels, one row of the two rows of sub-pixels includes a first color sub-pixel 110 and a second color sub-pixel 120, and the other row includes a third color sub-pixel 130. FIG. 1A illustratively shows sub-pixel groups arranged in a 2*2 array, and a first row of the two rows of sub-pixels includes the first color sub-pixel 110 and the second color sub-pixel 120, and a second row of the two rows of sub-pixels includes the third color sub-pixel 130.

As shown in FIG. 1A, the array substrate further includes at least one data line 200, such as a plurality of data lines 200. Each column of the sub-pixel groups corresponds to one data line 200, and each data line 200 is connected to each sub-pixel in the sub-pixel group 100 corresponding to the data line 200. That is, each data line 200 is connected to different color sub-pixels included in each sub-pixel group 100 in one column of the sub-pixel groups corresponding to the data line 200.

For example, each sub-pixel group 100 includes three different color sub-pixels respectively located in two rows, namely, a first color sub-pixel 110, a second color sub-pixel 120, and a third color sub-pixel 130. For example, the first color sub-pixel 110 and the second color sub-pixel 120 are a red sub-pixel and a green sub-pixel, respectively, and the third color sub-pixel 130 is a blue sub-pixel. Of course, the embodiments of the present disclosure are not limited to the case in which each sub-pixel group includes three sub-pixels of different colors, and each sub-pixel group can also include four or more sub-pixels of different colors, then a data line corresponding to each sub-pixel group is connected to each sub-pixel in the each sub-pixel group to provide a data signal.

In the embodiments of the present disclosure, the sub-pixels (e.g., sub-pixels of three different colors) in each column of sub-pixel groups share the same data line, so that the number of data lines can be reduced, thereby saving the space of the pixel layout, reducing the design cost of a data driving source (e.g., source COF) and a printed circuit board (PCB), reducing the bonding difficulty, and further improving the bonding yield.

For example, the three sub-pixels included in each sub-pixel group in the embodiments of the present disclosure can constitute one pixel, that is, each sub-pixel group is a pixel. In the case where the array substrate provided by the embodiments of the present disclosure is applied to a display device with 8 k resolution, an 8 k image displayed by the display device can include, for example, 7680*4320 pixels, so the number of PINs of a data driving source can be the number of data lines corresponding to 7680 pixels (i.e., 7680 sub-pixel groups), i.e., 7680. Compared with the case in which each pixel (including three sub-pixels of different colors) in a normal 8 k resolution display device corresponds to at least two data lines, the embodiments of the present disclosure at least reduce the number of data lines by 50%, and greatly simplifies the design of the data driving source and the wiring design, thus reducing the hardware cost.

For example, as shown in FIG. 1A, an orthographic projection of the gap 101 between the first color sub-pixel 110 and the second color sub-pixel 120 on a line along the X direction overlaps with an orthographic projection of the third color sub-pixel 130 on the line along the X direction.

For example, as shown in FIG. 1A, in the first direction, the size of the third color sub-pixel 130 is greater than the size of the first color sub-pixel 110, and the size of the third color sub-pixel 130 is greater than the size of the second color sub-pixel 120 in each sub-pixel group 100.

For example, in the first direction, the size of the third color sub-pixel 130 is greater than the sum of the size of the first color sub-pixel 110 and the size of the second color sub-pixel 120 in each sub-pixel group 100.

For example, in the first direction, the sum of the size of the first color sub-pixel 110, the size of the second color sub-pixel 120, and the size of the gap 101 between the first color sub-pixel 110 and the second color sub-pixel 120 in each sub-pixel group 100 is substantially equal to the size of the third color sub-pixel 130, and the center of the third color sub-pixel 130 has the same distance from the centers of the other two color sub-pixels (i.e., the first color sub-pixel 110 and the second color sub-pixel 120). The center line of the gap 101 between the first color sub-pixel 110 and the second color sub-pixel 120 in the Y direction coincides with the center line of the third color sub-pixel 130 in the Y direction, that is, the sub-pixels in the sub-pixel group 100 are arranged in an axisymmetric pattern.

For example, as shown in FIG. 1A, the first color sub-pixel 110 and the second color sub-pixel 120 have substantially the same shape and size. For example, the three sub-pixels in each sub-pixel group 100 are arranged in a substantially square shape.

For example, as shown in FIG. 1A, the data line 200 passes through the gap 101 between the first color sub-pixel 110 and the second color sub-pixel 120 in the sub-pixel group 100 corresponding to the data line 200, and in the second direction, the data line 200 bypasses an edge of the third color sub-pixel 130 from one side of the third color sub-pixel 130 to the other side of the third color sub-pixel 130. For example, a first portion of the data line 200 extending along the second direction passes through a gap between the first color sub-pixel 110 and the second color sub-pixel 120 which are connected to the first portion of the data line 200 in the sub-pixel group 100, and a second portion of the data line 200 bypasses an edge of the third color sub-pixel 130 from a first side of the third color sub-pixel 130 to a second side of the third color sub-pixel 130, the first side and the second side are respectively located on both sides of a center line of the third color sub-pixel 130 extending along the first direction. That is, the data line 200 bypasses the edge of the third color sub-pixel 130 from a side of the third color sub-pixel 130 in the M-th (M is an integer greater than 0) sub-pixel group 100 facing the second color sub-pixel 120 in the M-th sub-pixel group 100 to a side of the third color sub-pixel 130 in the M-th sub-pixel group 100 facing the second color sub-pixel 120 in the (M+1)-th sub-pixel group 100. The data line 200 in the embodiments of the present disclosure is a bent data line, that is, the data line 200 is not a straight line in shape.

For example, the data line 200 can bypass the right edge of the third color sub-pixel 130 or can bypass the left edge of the third color sub-pixel 130, and the bending directions of portions of the data line corresponding to two sub-pixel groups adjacent in the Y direction can be the same or different.

For example, as shown in FIG. 1A, the first portion of the data line 200 extending along the Y direction is located between the first color sub-pixel 110 and the second color sub-pixel 120 in the same column of the sub-pixel groups, and the second portion of the data line 200 extending along the Y direction is located between the two adjacent third color sub-pixels 130 in the two adjacent columns of sub-pixel groups.

For example, the bending directions of the plurality of data lines 200 can be the same or partially the same, as long as each data line 200 is connected to each sub-pixel in the sub-pixel groups 100 corresponding to the data line 200.

For example, as shown in FIG. 1A, the array substrate further includes at least one gate line group 300, and the gate line group 300 includes a first gate line 310, a second gate line 320, and a third gate line 330 extending along the first direction. In each row of sub-pixel groups, the first color sub-pixel 110 is connected to the first gate line 310, the second color sub-pixel 120 is connected to the second gate line 320, and the third color sub-pixel 130 is connected to the third gate line 330.

For example, sub-pixels of different colors in each sub-pixel group 100 are respectively connected to different gate lines, and the number of gate lines included in the gate line group 300 corresponding to each row of sub-pixel groups 100 is equal to the number of sub-pixels included in each sub-pixel group in the each row of sub-pixel groups. For example, each sub-pixel group can include four or more sub-pixels of different colors, the sub-pixels in the sub-pixel group share one data line, and each sub-pixel is connected to a different gate line.

For example, the first gate line 310 and the second gate line 320 are respectively located on both sides of the first color sub-pixel 110 in the second direction. That is, the first gate line 310 and the second gate line 320 are respectively located on both sides of the center line of the first color sub-pixel 110 extending along the first direction. In order to facilitate the connection of the first color sub-pixel 110 with the first gate line 310 and the connection of the second color sub-pixel 120 with the second gate line 320, the first gate line 310 and the second gate line 320 are illustratively disposed on both sides of the first color sub-pixel 110 in the second direction in the present embodiment, but the present embodiment is not limited to this case, and the first gate line and the second gate line can also be disposed on the same side of the first color sub-pixel in the second direction.

For example, as shown in FIG. 1A, the third gate line 330 can pass through the gap between the first color sub-pixel 110 and the third color sub-pixel 130 in each row of the sub-pixel groups, or can pass through the gap between two adjacent rows of the sub-pixel groups, without being limited in the present embodiment.

For example, as shown in FIG. 1A, the first gate line 310 is located on a side of the first color sub-pixel 110 away from the second gate line 320, and the third gate line 330 is located on a side of the second gate line 320 facing the third color sub-pixel 130.

Figure 1B:
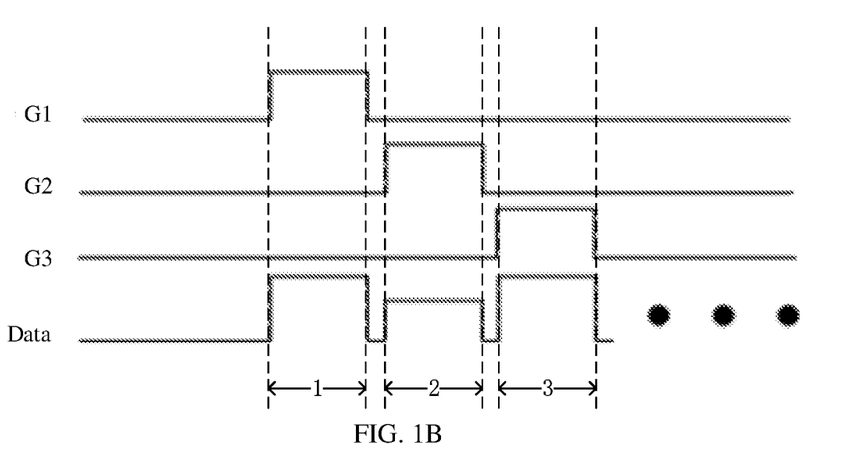
FIG. 1B is a signal timing chart during operation of one sub-pixel group shown in FIG. 1A.

FIG. 1B is a signal timing chart during operation of one sub-pixel group shown in FIG. 1A. G1, G2, G3 and Data shown in FIG. 1B respectively represent electric level signals input to the first gate line 310, the second gate line 320, the third gate line 330 and the data line 200 shown in FIG. 1A.

For example, as shown in FIG. 1A and FIG. 1B, in a first stage, a scanning signal input to the first gate line 310 is a high-level signal, a data signal input to the data line 200 is a high-level signal, and scanning signals input to the second gate line 320 and the third gate line 330 are low-level signals. In this case, a first thin film transistor (mentioned below) of the first color sub-pixel 110 is in an on state, a first thin film transistor (mentioned below) of the second color sub-pixel 120 and a first thin film transistor (mentioned below) of the third color sub-pixel 130 are in an off state, and the high-level data signal only charges a capacitor (mentioned below) in the first color sub-pixel 110 through the first thin film transistor of the first color sub-pixel 110. In a second stage, a scanning signal input to the second gate line 320 is a high-level signal, a data signal input to the data line 200 is a high-level signal, and scanning signals input to the first gate line 310 and the third gate line 330 are low-level signals. In this case, the first thin film transistor of the second color sub-pixel 120 is in an on state, the first thin film transistor of the first color sub-pixel 110 and the first thin film transistor of the third color sub-pixel 130 are in an off state, and the data signal only charges a capacitor (mentioned below) in the second color sub-pixel 120 through the first thin film transistor of the second color sub-pixel 120. In a third stage, a scanning signal input to the third gate line 330 is a high-level signal, a data signal input to the data line 200 is a high-level signal, and scan signals input to the second gate line 320 and the first gate line 310 are low-level signals. In this case, the first thin film transistor of the third color sub-pixel 130 is in an on state, the first thin film transistor of the second color sub-pixel 120 and the first thin film transistor of the first color sub-pixel 110 are in an off state, and the data signal only charges a capacitor (mentioned below) in the third color sub-pixel 130 through the first thin film transistor of the third color sub-pixel 130. Therefore, in the embodiments of the present disclosure, each sub-pixel group can realize display by time-divisionally inputting the control signals and the data signal through the three gate lines and the one data line corresponding to the each sub-pixel group.

For example, as shown in FIG. 1B, in the case where the sub-pixels included in each sub-pixel group are used to display pictures of different grayscale, the electric level signals of data signals input by the data lines to different sub-pixels are different.

Figure 2A:
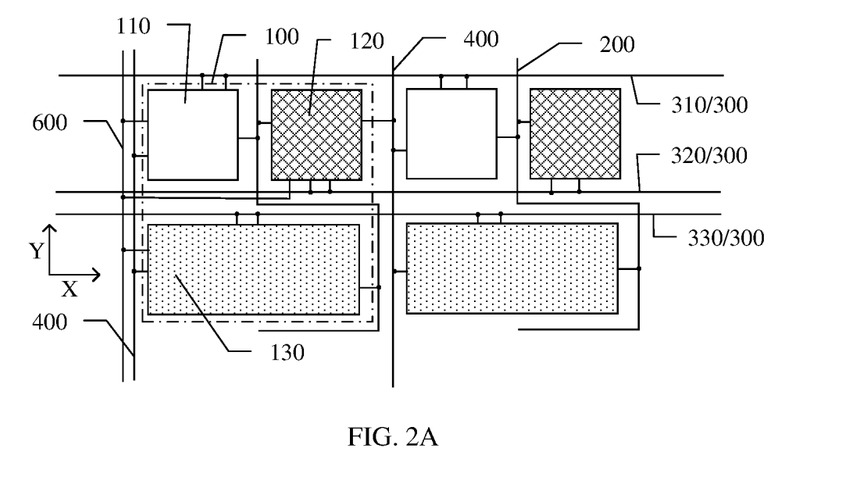
FIG. 2A is a partial structural diagram of an array substrate according to an example of an embodiment of the present disclosure.

FIG. 2A is a partial structural diagram of an array substrate provided by an example of an embodiment of the disclosure, and FIG. 2A illustratively shows two sub-pixel groups arranged in the first direction. As shown in FIG. 2A, the array substrate provided by the present example further includes a sensing line 400 extending along the second direction in addition to the structure shown in FIG. 1A. The sensing line 400 is located between two adjacent columns of sub-pixel groups, and the sensing line 400 is connected to the first color sub-pixel 110 and the third color sub-pixel 130 of the sub-pixel group 100 on one side of the sensing line 400 and is connected to the second color sub-pixel 120 of the sub-pixel group 100 on the other side of the sensing line 400. That is, one sensing line 400 is disposed between two adjacent sub-pixel groups 100, and the first color sub-pixel 110 and the third color sub-pixel 130 in one of the two sub-pixel groups 100 share one sensing line 400 with the second color sub-pixel 120 in the other of the two sub-pixel groups 100.

For example, as shown in FIG. 2A, the array substrate further includes a power line 600 extending along the second direction, the power line 600 is located between two adjacent columns of the sub-pixel groups, and the power line 600 is connected to each color sub-pixel in one column of the two adjacent columns of the sub-pixel groups adjacent to the power line 600. That is, one power line 600 corresponds to one column of the sub-pixel groups, and each color sub-pixel in the sub-pixel group 100 shares one power line 600.

For example, in a gap between the N-th sub-pixel group 100 and the (N+1)-th sub-pixel group 100 arranged along the first direction, the power line 600 is located on a side of the sensing line 400 away from the first color sub-pixel 110 and the third color sub-pixel 130 connected to the sensing line 400, and N is a positive integer greater than 0. For example, the first sub-pixel group 100 arranged along the direction indicated by the arrow in the X direction as shown in FIG. 2A can be the (N+1)-th sub-pixel group 100, the N-th sub-pixel group is not shown, and the gap between the N-th sub-pixel group 100 and the (N+1)-th sub-pixel group 100 in FIG. 2A is the gap on the side of the first sub-pixel group 100 arranged along the direction indicated by the arrow in the X direction away from the second sub-pixel group 100. As shown in FIG. 2A, the power line 600 is located on the side of the sensing line 400 away from the first color sub-pixel 110 and the third color sub-pixel 130 connected to the sensing line 400. The embodiments of the present disclosure are not limited to this case, the power line can be located on a side of the sensing line close to the first color sub-pixel and the third color sub-pixel connected to the sensing line, and specific wiring positions of the power line and the sensing line are determined according to the actual pixel layout.

Figure 2B:
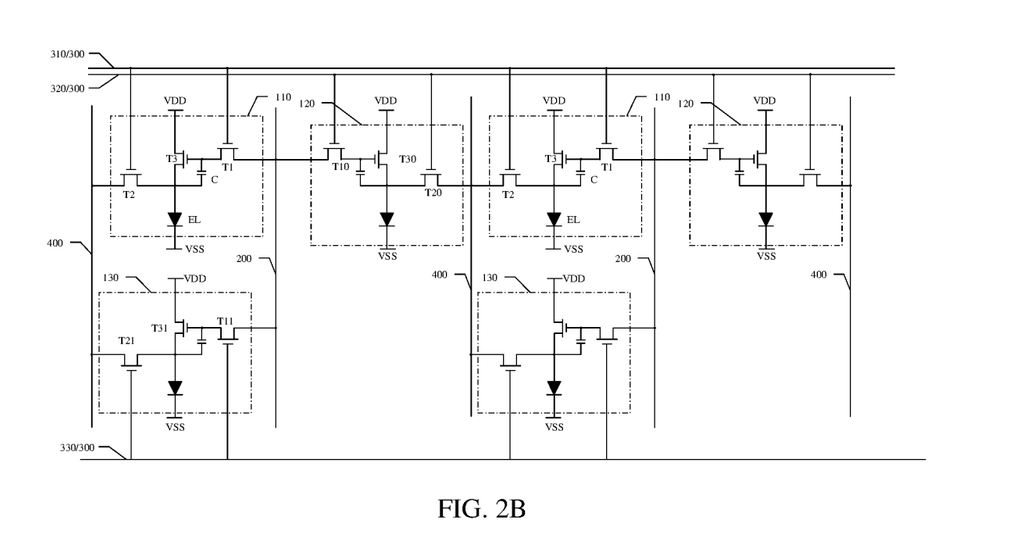
FIG. 2B is a schematic circuit diagram of two sub-pixel groups on the array substrate shown in FIG. 2A.

FIG. 2B is a schematic circuit diagram of two sub-pixel groups on the array substrate shown in FIG. 2A. The array substrate provided by the embodiments of the present disclosure can be applied to an organic light emitting diode (OLED) display device or a quantum dot light emitting diode (QLED) device. The pixel circuit in the OLED display device generally adopts a matrix drive mode, which is divided into active matrix drive and passive matrix drive according to whether a switching element is introduced into each pixel. The AMOLED integrates a set of thin film transistors and a storage capacitor in the pixel circuit of each pixel. Through the driving control of the thin film transistors and storage capacitor, the current flowing through the OLED is controlled, so that the OLED emits light as required.

FIG. 2B illustratively shows that the pixel circuit of each sub-pixel is a 3T1C pixel circuit, that is, three thin film transistors (TFTs) and one storage capacitor C are used to realize the function of driving an OLED to emit light. It should be noted that the pixel circuit of each sub-pixel is not limited to 3T1C, and the number of thin film transistors and that of storage capacitors can be increased as long as one of the thin film transistors is connected to the sensing line. Of course, the pixel circuit of each sub-pixel can also be a 2T1C pixel circuit, that is, it includes one switching transistor, one driving transistor and one storage capacitor.

As shown in FIG. 2B, taking the first color sub-pixel 110 as an example, the 3T1C pixel circuit includes a first thin film transistor T1, a second thin film transistor T2, a driving transistor T3, a storage capacitor C, and a light emitting element EL. The first thin film transistor T1 is a switching transistor and the second thin film transistor T2 is a compensation transistor. The first thin film transistor T1, the driving transistor T3, and the storage capacitor C described above forms a 2T1C pixel circuit.

For example, the first thin film transistor T1, the second thin film transistor T2, and the drive transistor T3 can be top-gate thin film transistors.

For example, the light emitting element EL can be an organic light emitting diode, but the embodiments of the present disclosure are not limited thereto, and the light emitting element EL can also be, for example, a quantum dot light emitting diode (QLED), etc.

For example, the light emitting element can be a top-emitting organic light emitting diode, each sub-pixel group can include a red sub-pixel, a green sub-pixel and a blue sub-pixel, and the three sub-pixels of different colors share one data line. The present embodiment is not limited to this case. The light emitting element can also be a bottom-emitting organic light emitting diode, each sub-pixel can include a red sub-pixel, a green sub-pixel, a blue sub-pixel and a white sub-pixel, and the four sub-pixels of different colors share one data line.

For example, as shown in FIG. 2A and FIG. 2B, a gate electrode of the first thin film transistor T1 is turned on according to a scanning signal received through the first gate line 310, a first electrode of the first thin film transistor T1 is connected to the data line 200 to receive a data signal Vdata, a second electrode of the first thin film transistor T1 is connected to a gate electrode of the driving transistor T3, and a switching operation can be performed to transmit the data signal Vdata from the data line 200 to the gate electrode of the driving transistor T3; a first electrode of the driving transistor T3 is connected to the power line 600 to receive a first voltage VDD (a high voltage, such as a constant positive voltage), a second electrode of the driving transistor T3 is connected to a positive terminal (an anode) of the light emitting element EL, and the driving transistor T3 is configured to supply an emission current $I_{OLED}$ to the light emitting element EL; a first electrode of the storage capacitor C is connected to the second electrode of the first thin film transistor T1 and the gate electrode of the driving transistor T3, and a second electrode of the storage capacitor C is connected to the second electrode of the driving transistor T3; a negative terminal (a cathode) of the light emitting element EL is configured to receive a second voltage VSS (a low voltage, such as a ground voltage). In the case where a scanning signal is applied through the first gate line 310 to turn on the first thin film transistor T1, the data signal Vdata input by a data drive circuit through the data line 200 can charge the storage capacitor C via the first thin film transistor T1, so that the data signal Vdata can be stored in the storage capacitor C, and the stored data signal Vdata can control a conduction degree of the driving transistor T3, thereby controlling the magnitude of a current flowing through the driving transistor T3 to drive the light emitting element EL to emit light, that is, the current determines the grayscale of the light emitted by the first color sub-pixel 110.

Similarly, in the second color sub-pixel 120, a gate electrode of the first thin film transistor T10 is turned on according to a scanning signal received through the second gate line 320, a first electrode of the first thin film transistor T10 is connected to the data line 200 to receive a data signal Vdata, and a second electrode of the first thin film transistor T10 is connected to a gate electrode of the driving transistor T30; a first electrode of the driving transistor T30 is connected to the power line 600 to receive the first voltage VDD (a high voltage, such as a constant positive voltage), and a second electrode of the driving transistor T30 is connected to a positive terminal of the light emitting element; a first electrode of the storage capacitor is connected to the second electrode of the first thin film transistor T10 and the gate electrode of the driving transistor T30, and the second electrode of the storage capacitor is connected to the second electrode of the driving transistor T30; a negative terminal of the light emitting element is configured to receive the second voltage VSS (a low voltage, such as a ground voltage). In the case where a scanning signal is applied through the second gate line 320 to turn on the first thin film transistor T10, the data signal Vdata input by the data driving circuit through the data line 200 can charge the storage capacitor via the first thin film transistor T10, so that the data signal Vdata can be stored in the storage capacitor, and the stored data signal Vdata can control a conduction degree of the driving transistor T30, thereby controlling the magnitude of a current flowing through the driving transistor T30 to drive the light emitting element to emit light, that is, the current determines the grayscale of the light emitted by the second color sub-pixel 120.

In the third color sub-pixel 130, a gate electrode of the first thin film transistor T11 is turned on according to a scanning signal received through the third gate line 330, a first electrode of the first thin film transistor T11 is connected to the data line 200 to receive a data signal Vdata, and a second electrode of the first thin film transistor T11 is connected to a gate electrode of the driving transistor T31; a first electrode of the driving transistor T31 is connected to the power line 600 to receive the first voltage VDD (a high voltage, such as a constant positive voltage), and a second electrode of the driving transistor T31 is connected to a positive terminal of the light emitting element; a first electrode of the storage capacitor is connected to the second electrode of the first thin film transistor T11 and the gate electrode of the driving transistor T31, and a second electrode of the storage capacitor is connected to the second electrode of the driving transistor T31; a negative terminal of the light emitting element is configured to receive the second voltage VSS (a low voltage, such as a ground voltage). In the case where a scanning signal is applied through the third gate line 330 to turn on the first thin film transistor T11, the data signal Vdata input by the data driving circuit through the data line 200 can charge the storage capacitor via the first thin film transistor T11, so that the data signal Vdata can be stored in the storage capacitor, and the stored data signal Vdata can control a conduction degree of the driving transistor T31, thereby controlling the magnitude of a current flowing through the driving transistor T31 to drive the light emitting element to emit light, that is, the current determines the grayscale of the light emitted by the third color sub-pixel 130.

At present, a large-size display panel usually compensates the pixel circuit by combining electrical compensation and optical compensation, which can integrate the advantages of the electrical compensation and the optical compensation and improve the uniformity of the display panel. In general, the electrical compensation can determine compensation data according to the voltage or current of the pixel circuit acquired by the sensing line, so as to compensate for the characteristics of the driving thin film transistor (e.g., threshold voltage, mobility, etc.); and the optical compensation can compensate for the uniformity of the display panel overall.

For example, the pixel circuit of each sub-pixel shown in FIG. 2B is a pixel circuit that can detect the threshold voltage of the driving transistor. Taking the first color sub-pixel 110 as an example, the second thin film transistor T2 in the pixel circuit is a sensing transistor, and the first electrode of the sensing transistor T2 is connected to a detection circuit (not shown) via the sensing line, so as to realize a compensation function. As shown in FIG. 2B, taking the first color sub-pixel 110 as an example, after the driving transistor T3 is turned on, the detection circuit can be charged via the second thin film transistor T2, so that the potential of the second electrode of the driving transistor T3 is changed. When the voltage Vs of the second electrode of the driving transistor T3 is equal to a difference between the gate voltage Vg of the driving transistor T3 and the threshold voltage Vth of the driving transistor T3, the driving transistor T3 is turned off. At this time, after the driving transistor T3 is turned off, a sensing voltage (that is, the voltage Vb of the source electrode after the driving transistor T3 is turned off) can be acquired from the second electrode of the driving transistor T3 via the second thin film transistor T2 which is turned on. After obtaining the voltage Vb of the source electrode after the driving transistor T3 is turned off, the threshold voltage Vth=Vdata−Vb of the driving transistor T3 can be obtained. Therefore, the compensation data can be established for each pixel circuit based on the threshold voltage of the driving transistor in each pixel circuit, and further, the threshold voltage compensation function of each sub-pixel on the array substrate can be realized.

For example, the second electrode of the second thin film transistor T2 can also input a sensed current at the positive terminal of the light emitting element EL to the detection circuit via the sensing line, so as to obtain the current used to drive the light emitting element EL to emit light, and then the compensation data for each light emitting element based on the current can be established, and further, the optical compensation for each sub-pixel light emitting element is realized, thus realizing overall compensation for the uniformity of the display panel.

As shown in FIG. 2B, the first thin film transistor T1 and the second thin film transistor T2 in the first color sub-pixel 110 are both connected to the first gate line 310, the first thin film transistor T10 and the second thin film transistor T20 in the second color sub-pixel 120 are both connected to the second gate line 320, and the first thin film transistor T11 and the second thin film transistor T21 in the third color sub-pixel 130 are both connected to the third gate line 330. That is, the first thin film transistor and the second thin film transistor in each sub-pixel are both connected to the same gate line, and the first thin film transistor and the second thin film transistor can be simultaneously controlled to be turned on or off through the same gate line. The present embodiment is not limited thereto, and the first thin film transistor and the second thin film transistor in each sub-pixel can also be connected to different gate lines, in which case the first thin film transistor and the second thin film transistor in each sub-pixel can be turned on in a time-divisional manner.

According to the embodiments of the present disclosure, the number of gate lines corresponding to each row of the sub-pixel groups is set to be consistent with the number of sub-pixels included in each sub-pixel group, so that the sub-pixels in each sub-pixel group can share one data line to reduce the number of data lines and save the space of the pixel layout, thereby not only reducing the design cost, but also reducing the bonding difficulty and further improving the bonding yield. In the embodiments of the present disclosure, the layout space can be saved by reducing the number of data lines, and the saved space can not only increase bonding space, but also be used for setting sensing lines to realize electrical and optical compensation for sub-pixels.

For example, in the case where the array substrate provided by the embodiments of the present disclosure is applied to a display device with 8 k resolution, an 8 k image displayed by the display device can include, for example, 7680*4320 pixels, so the number of PINs of a data driving source can be the number of data lines and sensing lines (each sub-pixel corresponds to one data line and one sensing line) corresponding to 7680 pixels (i.e., 7680 sub-pixel groups), i.e., 15360. Compared with the case in which each pixel (including three sub-pixels of different colors) in a normal 8 k resolution display device corresponds to at least two data lines and one sensing line, the embodiments of the present disclosure at least reduces the number of PINs of the data driving source by 33%, and greatly simplifies the design of the data driving source and the wiring design, thus reducing the hardware cost.

Figure 3A:
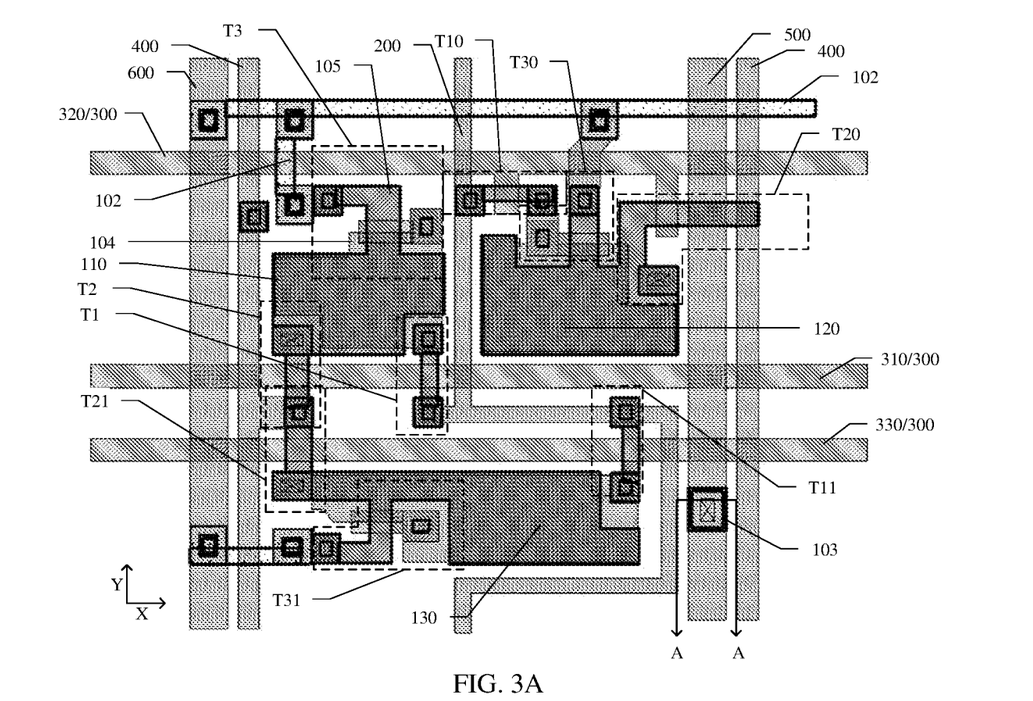
FIG. 3A is a pixel layout of one sub-pixel group shown in FIG. 2A.

FIG. 3A is a pixel layout of a sub-pixel group shown in FIG. 2A. As shown in FIG. 3A, taking the first color sub-pixel 110 as an example for description, the gate electrode of the first thin film transistor T1 is connected to the first gate line 310, the gate electrode of the first thin film transistor T1 is located on the same layer as the first gate line 310 and has the same material. For example, the gate electrode of the first thin film transistor T1 can be a part of the first gate line 310, so as to save layout space. The first electrode of the first thin film transistor T1 is connected to the data line 200. For example, a conductive layer (SD layer) where the data line 200 is located is connected to a source region (a conductive region in the semiconductor layer 105) of the first thin film transistor T1 through a via hole, so as to form the first electrode, and the conductive layer 104 (i.e., SD layer) provided on the same layer as the data line 200 is connected to a drain region (a conductive region in the semiconductor layer 105) of the first thin film transistor T1 through a via hole, so as to form the second electrode of the first thin film transistor T1. For example, the two via holes respectively corresponding to the source region and the drain region of the first thin film transistor T1 can be via holes located in an insulating layer between the semiconductor layer 105 and the conductive layer 104 where the data line 200 is located, and the two via holes can be located on both sides of the first gate line 310, respectively. For example, the film layer where the first gate line 310 is located can be on a side of the semiconductor layer 105 away from the conductive layer where the data line 200 is located, that is, the film layer where the gate line group is located is located on a side of the semiconductor layer close to the base substrate (not shown in the figure). The gate electrode of the driving transistor T3 is connected to the conductive layer 104 where the second electrode of the first thin film transistor T1 is located through a via hole. For example, the conductive layer 104 where the second electrode of the first thin film transistor T1 is located is electrically connected to the gate electrode of the driving transistor T3 through a via hole provided in an insulating layer between the gate electrode of the driving transistor T3 and the conductive layer 104. The power line 600 is electrically connected to a conductive light shielding layer 102 through a via hole. For example, the power line 600 and the data line 200 are located on the same side and can be formed by patterning the same metal layer. For example, the light shielding layer 102 is located on a side of the power line 600 facing the base substrate. The first electrode of the driving transistor T3 is electrically connected to the power line 600 through the light shielding layer 102. For example, the conductive layer 104 is connected to a source region (a conductive region in the semiconductor layer 105) of the driving transistor T3 through a via hole, so as to form the first electrode, the conductive layer 104 corresponding to the first electrode is connected to a portion of the light shielding layer 102 through a via hole, and another portion of the light shielding layer 102 is connected to the power line 600 through a via hole. For example, the via hole corresponding to the gate electrode of the driving transistor T3 and the via hole corresponding to the first electrode of the driving transistor T3 are located on a side of the second gate line 320 close to the gate electrode of the driving transistor T3, while the portion of the light shielding layer 102 which is electrically connected to the power line 600 and extends along the X direction is located on the other side of the second gate line 320. The second electrode of the driving transistor T3 can serve as the second electrode of the storage capacitor, the gate electrode of the driving transistor T3 (i.e. the conductive layer 104 connected to the gate electrode) can serve as the first electrode of the storage capacitor, and an insulating layer is arranged between the second electrode of the storage capacitor and the first electrode of the storage capacitor. The gate electrode of the second thin film transistor T2 in the first color sub-pixel 110 is connected to the first gate line 310, the gate electrode of the second thin film transistor T2 is located on the same layer as the first gate line 310 and has the same material. For example, the gate electrode of the second thin film transistor T2 can be a part of the first gate line 310. The first electrode of the second thin film transistor T2 is connected to the sensing line 400. For example, the sensing line 400 can be connected to a source region (a conductive region of the semiconductor layer 105) of the second thin film transistor T2 through a via hole, so as to form the first electrode, and the second electrode of the second thin film transistor T2 is connected to the anode (not shown in the figure) of the light emitting element through a via hole. For example, the sensing line 400 and the data line 200 are located on the same layer, and both of them can be formed by patterning the same conductive layer. Two via holes corresponding to the first electrode of the second thin film transistor T2 and the second electrode of the second thin film transistor T2 are located on both sides of the first gate line 310, respectively.

For example, as shown in FIG. 3A, taking the second color sub-pixel 120 as an example for description, the gate electrode of the first thin film transistor T10 is connected to the second gate line 320, the first electrode of the first thin film transistor T10 is connected to the data line 200, and the second electrode of the first thin film transistor T10 is connected to the gate electrode of the driving transistor T30. The connection mode between each electrode of the first thin film transistor T10 in the second color sub-pixel 120 and the corresponding components is the same as the connection mode between each electrode of the first thin film transistor T1 in the first color sub-pixel 110 and the corresponding components, and details will not be repeated here. The gate electrode of the driving transistor T30 can serve as the first electrode of the storage capacitor, the first electrode of the driving transistor T30 is electrically connected to the power line 600 through the light shielding layer 102, and the second electrode of the driving transistor T30 not only is configured to be connected to the anode of the light emitting element, but also serves as the second electrode of the storage capacitor. The connection mode between each electrode of the driving transistor T30 in the second color sub-pixel 120 and the corresponding components is the same as the connection mode between each electrode of the driving transistor T3 in the first color sub-pixel 110 and the corresponding components, and details will not be repeated here. The gate electrode of the second thin film transistor T20 is connected to the second gate line 320, the first electrode of the second thin film transistor T20 is connected to the sensing line 400, and the second electrode of the second thin film transistor T20 is connected to the anode of the light emitting element. The connection mode between each electrode of the second thin film transistor T20 in the second color sub-pixel 120 and the corresponding components is the same as the connection mode between each electrode of the second thin film transistor T2 in the first color sub-pixel 110 and the corresponding components, and details will not be repeated here.

For example, as shown in FIG. 3A, taking the third color sub-pixel 130 as an example for description, the gate electrode of the first thin film transistor T11 is connected to the third gate line 330, the first electrode of the first thin film transistor T11 is connected to the data line 200, the second electrode of the first thin film transistor T11 is connected to the gate electrode of the driving transistor T31, and the gate electrode of the driving transistor T31 can serve as the first electrode of the storage capacitor. The first electrode of the driving transistor T31 is electrically connected to the power line 600 through the light shielding layer 102, and the second electrode of the driving transistor T31 not only is configured to be connected to the anode of the light emitting element, but also serves as the second electrode of the storage capacitor. The gate electrode of the second thin film transistor T21 is connected to the third gate line 330, the first electrode of the second thin film transistor T21 is connected to the sensing line 400, and the second electrode of the second thin film transistor T21 is connected to the anode of the light emitting element. The connection mode between each thin film transistor in the third color sub-pixel 130 and the corresponding components is the same as the connection mode between each thin film transistor in the first color sub-pixel 110 and the corresponding components, and details will not be repeated here.

For example, the embodiments of the present disclosure are described by taking that the light emitting element is a top-emitting organic light emitting diode as an example, and the light emitting element includes a transparent cathode, a light emitting layer and an anode, and the transparent cathode is located at a light-exiting side of the light emitting layer. For example, the array substrate includes a base substrate, and the transparent cathode is located on a side of the light emitting layer away from the base substrate.

Figure 3B:
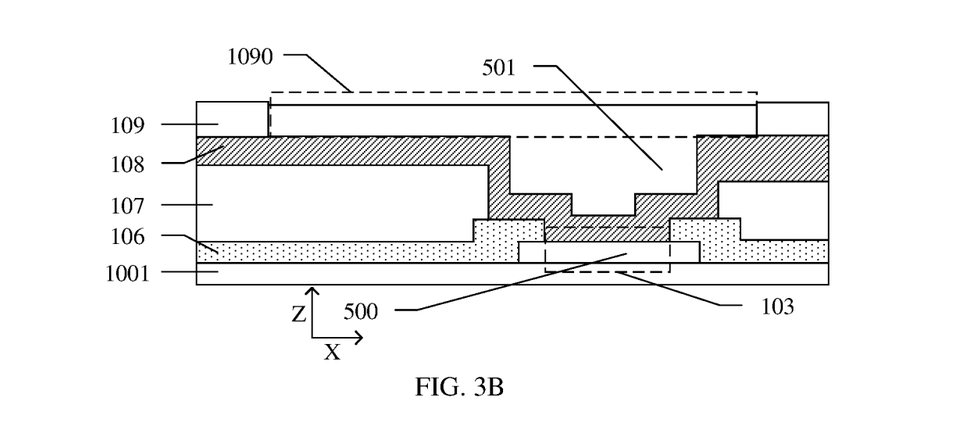
FIG. 3B is a partial cross-sectional view of the array substrate taken along line AA shown in FIG. 3A.

For example, FIG. 3B is a partial cross-sectional view of the array substrate taken along line AA shown in FIG. 3A. As shown in FIG. 3A and FIG. 3B, the array substrate further includes a plurality of auxiliary electrodes 500 extending along the second direction, and the auxiliary electrodes 500 are electrically connected to the cathodes 501 of the light emitting elements included in the sub-pixels. FIG. 3B illustratively shows only the auxiliary electrode 500 on the base substrate 1001, and does not show other film layers between the auxiliary electrode 500 and the base substrate 1001. FIG. 3A shows only the auxiliary electrode 500, and does not show the base substrate and the film layers on the side of the auxiliary electrode 500 away from the base substrate, and the opening 103 in FIG. 3A is an opening for exposing the auxiliary electrode 500.

For example, the opening 103 shown in FIG. 3A is an opening provided in the passivation layer 106 on a side of the auxiliary electrode 500 away from the base substrate 1001 shown in FIG. 3B for exposing the auxiliary electrode 500. The array substrate further includes a resin layer 107 provided on a side of the passivation layer 106 away from the base substrate 1001, and the resin layer 107 is provided with a resin opening for exposing the opening 103. An anode material layer 108 is provided on a side of the resin layer 107 away from the base substrate 1001, and the anode material layer 108 has the same material as the anode of the light emitting element, but they are not connected with each other. The anode material layer 108 is located in the opening 103 and on the resin layer 107 surrounding the opening 103, and the anode material layer 108 is in contact with the auxiliary cathode 500 through the opening 103, so as to realize an electrical connection therebetween.

For example, as shown in FIG. 3B, the array substrate further includes a pixel defining layer 109 on the anode material layer 108, the pixel defining layer 109 is provided with an opening 1090 for exposing the opening 103, and a transparent cathode 501 of the light emitting element is provided in the opening 1090 of the pixel defining layer 109. The transparent cathode 501 can be electrically connected with the auxiliary cathode 500 through the anode material layer 108, so that the resistance of the transparent cathode 501 can be reduced, the voltage drop thereof can be reduced, and further the design of a large-size top-emitting organic light emitting diode display device can be realized. In the embodiments of the present disclosure, the anode material layer 108 is provided in the opening 103 exposing the auxiliary cathode 500 in order to prevent the material of the transparent cathode 501 from breaking when directly formed in the opening 103, that is, the anode material layer 108 serves as a transitional conductive layer. The present embodiment is not limited to this case, and the transparent cathode can be directly formed in the opening to directly contact the auxiliary electrode.

The wiring space saved by reducing the number of data lines in the embodiments of the present disclosure can be used for setting auxiliary electrodes, so as to effectively reduce the voltage drop of the cathode of the light emitting element.

For example, FIG. 3A illustratively shows that the auxiliary electrode 500 corresponding to one sub-pixel group can be exposed by one opening 103, so as to realize an electrical connection with the cathode of the light emitting element. The present embodiment is not limited to this case, and the auxiliary electrode can also be exposed by two or more openings as long as the auxiliary electrode 500 exposed by the openings 103 can be electrically connected with the cathode to effectively reduce the voltage drop of the cathode.

For example, the array substrate can include at least one auxiliary electrode 500.

For example, the array substrate includes a plurality of auxiliary electrodes 500, and at least one column of sub-pixel groups is included between two adjacent auxiliary electrodes 500.

For example, the number of columns of sub-pixel groups included between two adjacent auxiliary electrodes 500 can be the same or different. In order to simplify the process and make the voltage drop of the cathodes of the light emitting elements on the entire array substrate uniform, the auxiliary electrodes can be uniformly arranged in the array substrate.

Figure 4:
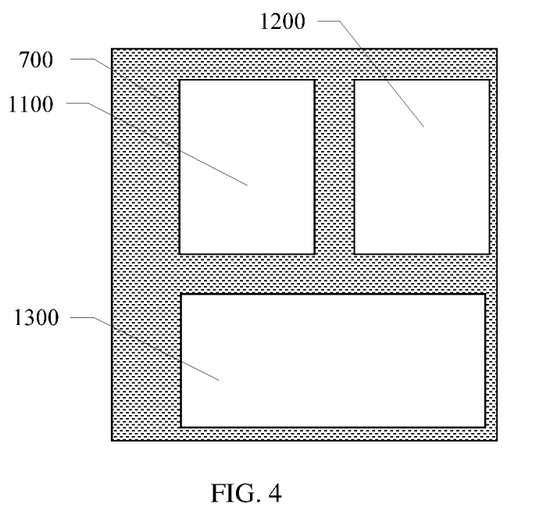
FIG. 4 is a schematic diagram of an opposite substrate corresponding to an array substrate including the pixel layout shown in FIG. 3A.

For example, FIG. 4 is a schematic diagram of an opposite substrate corresponding to an array substrate including the pixel layout shown in FIG. 3A. FIG. 4 illustratively shows a schematic view of an opposite substrate corresponding to one sub-pixel group shown in FIG. 3A. As shown in FIG. 4, the opposite substrate includes a first color sub-pixel light transmission region 1100, a second color sub-pixel light transmission region 1200 and a third color sub-pixel light transmission region 1300 corresponding to three different color sub-pixels, as well as a black matrix 700 between these light transmission regions.

For example, a first color filter film can be disposed in the first color sub-pixel light transmission region 1100 corresponding to the first color sub-pixel on the opposite substrate, so as to selectively transmit the first color light; similarly, a second color filter film can be disposed in the second color sub-pixel light transmission region 1200 to selectively transmit the second color light, and a third color filter film can be disposed in the third color sub-pixel light transmission region 1300 to selectively transmit the third color light. By arranging filter films of different colors in different light transmission regions, different colors of light emitted by sub-pixels can be filtered to improve color purity.

Figure 5:
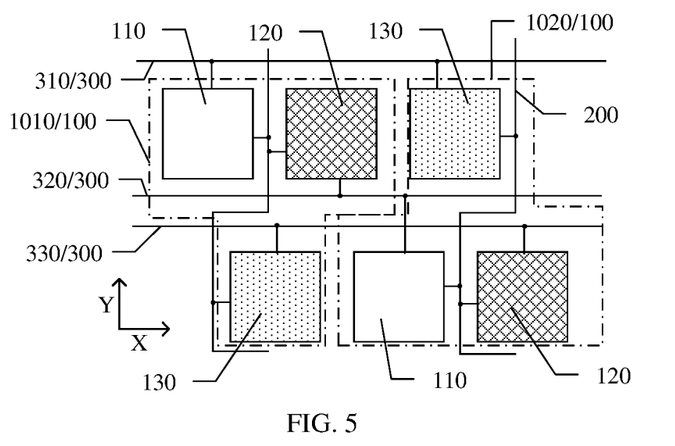
FIG. 5 is a partial structural diagram of an array substrate according to another embodiment of the present disclosure.

For example, FIG. 5 is a partial structural diagram of an array substrate provided by another embodiment of the present disclosure. Different from the embodiment shown in FIG. 1A, the plurality of sub-pixel groups 100 in the present embodiment include a first sub-pixel group 1010 and a second sub-pixel group 1020 which are alternately arranged along a first direction (i.e., X direction shown in the figure), and a direction along which the center of the third color sub-pixel 130 points to a midpoint of a line connecting the center of the first color sub-pixel 110 and the center of the second color sub-pixel 120 in the first sub-pixel group 1010 is the first direction, that is, the direction indicated by the arrow in the Y direction shown in the figure is the first direction; a direction along which the center of the third color sub-pixel 130 points to a midpoint of the line connecting the center of the first color sub-pixel 110 and the center of the second color sub-pixel 120 in the second sub-pixel group 1020 is a second direction, and the first direction is opposite to the second direction. That is, an arrangement order of a row in which the first color sub-pixel 110 and the second color sub-pixel 120 are located and a row in which the third color sub-pixel 130 is located along the second direction in the first pixel group 1010 is opposite to an arrangement order of a row in which the first color sub-pixel 110 and the second color sub-pixel 120 are located and a row in which the third color sub-pixel 130 is located along the second direction in the second pixel group 1020.

For example, as shown in FIG. 5, the first color sub-pixel 110 in the first sub-pixel group 1010 and the third color sub-pixel 130 in the second sub-pixel group 1020 are connected to the first gate line 310, the second color sub-pixel 120 in the first sub-pixel group 1010 and the first color sub-pixel 110 in the second sub-pixel group 1020 are connected to the second gate line 320, and the third color sub-pixel 130 in the first sub-pixel group 1010 and the second color sub-pixel 120 in the second sub-pixel group 1020 are connected to the third gate line 330. The present embodiment is not limited thereto, as long as three sub-pixels of different colors in each sub-pixel group are connected to different gate lines respectively. In the embodiments of the present disclosure, the sub-pixels in each sub-pixel group are connected to the same data line, and different sub-pixels in each sub-pixel group are connected to different gate lines.

In the present embodiment, the third color sub-pixels 130 disposed in the two sub-pixel groups 100 adjacent in the first direction are located in different rows, for example, the third color sub-pixel 130 in the first sub-pixel group 1010 is located in the second row, and the third color sub-pixel 130 in the second sub-pixel group 1020 is located in the first row. That is, the three sub-pixels included in the first sub-pixel group 1010 are arranged in an inverted triangle manner, and the three sub-pixels included in the second sub-pixel group 1020 are arranged in a forward triangle manner.

The sensing lines, the power lines and the auxiliary electrodes shown in FIG. 1A to FIG. 4 are included in the present embodiment, and the locations of the data lines, the gate lines, the sensing lines, the power lines and the auxiliary electrodes in the present embodiment can be the same as the locations of the data lines, the sensing lines, the power lines and the auxiliary electrodes in the embodiments shown in FIG. 1 A to FIG. 4, and details will not be repeated here.

The pixel circuit structure of each sub-pixel in the present embodiment can be the same as the pixel circuit structure of each sub-pixel in the embodiments shown in FIG. 1 A to FIG. 4, that is, each sub-pixel in the present embodiment can include a 3T1C structure, but is not limited thereto, and the number of thin film transistors and that of storage capacitors can be increased as long as one of the thin film transistors is connected to a sensing line. Of course, the pixel circuit of each sub-pixel can also be a 2T1C pixel circuit, that is, it includes a switching transistor, a driving transistor and a storage capacitor.

The connection relationship between each signal line and the sub-pixels in the present embodiment can also be the same as the connection relationship between each signal line and the sub-pixels in the embodiments shown in FIG. 1 A to FIG. 4, and details will not be repeated here.

For example, as shown in FIG. 5, each color sub-pixel in the sub-pixel group 100 has the same shape and size, and the first color sub-pixel 110, the second color sub-pixel 120, and the third color sub-pixel 130 are a red sub-pixel, a green sub-pixel and a blue sub-pixel, respectively.

Another embodiment of the present disclosure provides a display device, which includes the array substrate described in any one of the above embodiments. The number of data lines in the display device adopting the array substrate is relatively small, ultra-high resolution can be realized in a limited wiring space, and the cost of the display device can be reduced.

For example, the display device provided by the embodiment of the present disclosure can be an organic light emitting diode display device, and the resolution of the display device can be 8 k.

For example, an 8 k image displayed by the display device provided by the embodiment of the present disclosure can include 7680*4320 pixels, that is, the number of pixels in a row arranged in the horizontal direction is about 7680, and the number of pixels in a column arranged in the vertical direction is about 4320.

The following statements should be noted:
(1) The accompanying drawings involve only the structure(s) in connection with the embodiment(s) of the present disclosure, and other structure(s) can be referred to common design(s).
(2) In case of no conflict, features in one embodiment or in different embodiments can be combined.

What have been described above are only specific implementations of the present disclosure, the protection scope of the present disclosure is not limited thereto. Therefore, the protection scope of the present disclosure should be based on the protection scope of the claims.

What is claimed is:

1. An array substrate, comprising:
   a plurality of sub-pixel groups arranged in an array along a first direction and a second direction, at least one of the plurality of sub-pixel groups comprising two rows of sub-pixels arranged along the second direction, one row of the two rows of sub-pixels comprising a first color sub-pixel and a second color sub-pixel, and the other row of the two rows of sub-pixels comprising a third color sub-pixel; and
   at least one data line,
   wherein the first color sub-pixel, the second color sub-pixel and the third color sub-pixel in each of the plurality of sub-pixel groups are connected to a same date line of the at least one data line;
   the array substrate further comprising:
   at least one gate line group, the at least one gate line group comprising a first gate line, a second gate line and a third gate line which are extended along the first direction, wherein, in each of the plurality of sub-pixel groups, the first color sub-pixel is connected to the first gate line, the second color sub-pixel is connected to the second gate line, and the third color sub-pixel is connected to the third gate line.

2. The array substrate according to claim 1, wherein a first portion of the data line extending along the second direction passes through a gap between the first color sub-pixel and the second color sub-pixel which are connected to the first portion of the data line in the sub-pixel group, and a second portion of the data line bypasses an edge of the third color sub-pixel from a first side of the third color sub-pixel to a second side of the third color sub-pixel, the first side and the second side are respectively located on both sides of a center line of the third color sub-pixel extending along the first direction.

3. The array substrate according to claim 1, wherein the first gate line and the second gate line are respectively located on both sides of a center line of the first color sub-pixel extending along the first direction.

4. The array substrate according to claim 1, further comprising:
   a sensing line, extending along the second direction and located between adjacent ones of the plurality of sub-pixel groups,
   wherein the sensing line is connected to the first color sub-pixel and the third color sub-pixel of the sub-pixel group on one side of the sensing line and is connected to the second color sub-pixel of the sub-pixel group on the other side of the sensing line.

5. The array substrate according to claim 4, wherein each of the sub-pixels further comprises a pixel circuit, the pixel circuit is configured to drive each of the sub-pixels, the pixel circuit comprises a first thin film transistor, a second thin film transistor, a driving transistor, a storage capacitor and a light emitting element, a gate electrode of the first thin film transistor and a gate electrode of the second thin film transistor are connected to a same gate line, a first electrode of the first thin film transistor is connected to the data line, a first electrode of the second thin film transistor is connected to the sensing line, and a second electrode of the second thin film transistor is connected to an anode of the light emitting element;

a gate electrode of the driving transistor is connected to a second electrode of the first thin film transistor, and a second electrode of the driving transistor is connected to the anode of the light emitting element;

a first electrode of the storage capacitor is connected to the gate electrode of the driving transistor, and a second electrode of the storage capacitor is connected to the second electrode of the driving transistor.

6. The array substrate according to claim 5, further comprising:

an auxiliary electrode extending along the second direction, wherein the auxiliary electrode is electrically connected to a cathode of the light emitting element, and the light emitting element is a top-emitting organic light emitting diode.

7. The array substrate according to claim 6, wherein the array substrate comprises a plurality of auxiliary electrodes, and at least one column of the plurality of sub-pixel groups is included between adjacent ones of the plurality of auxiliary electrodes.

8. The array substrate according to claim 5, further comprising:

a plurality of power lines extending along the second direction, each of the plurality of power lines being located between adjacent ones of the plurality of sub-pixel groups, wherein each of the plurality of sub-pixel groups corresponds to one power line, and each of the plurality of power lines is connected to a first electrode of the driving transistor included in each of the sub-pixels in the corresponding sub-pixel group.

9. The array substrate according to claim 8, wherein, in a gap between an N-th sub-pixel group and a (N+1)-th sub-pixel group arranged along the first direction, the power line is located on a side of the sensing line away from the first color sub-pixel and the third color sub-pixel connected to the sensing line, and N is a positive integer greater than 0.

10. The array substrate according to claim 1, wherein, in at least one of the plurality of sub-pixel groups, an orthographic projection of a gap between the first color sub-pixel and the second color sub-pixel on a line along the first direction overlaps with an orthographic projection of the third color sub-pixel on the line along the first direction.

11. The array substrate according to claim 1, wherein, in the first direction, a size of the third color sub-pixel is greater than a sum of a size of the first color sub-pixel and a size of the second color sub-pixel in each of the plurality of sub-pixel groups.

12. The array substrate according to claim 11, wherein, in the first direction, a sum of the size of the first color sub-pixel, the size of the second color sub-pixel, and a size of a gap between the first color sub-pixel and the second color sub-pixel is substantially equal to the size of the third color sub-pixel, and a distance between a center of the third color sub-pixel and a center of the first color sub-pixel is the same as a distance between the center of the third color sub-pixel and a center of the second color sub-pixel in each of the plurality of sub-pixel groups.

13. The array substrate according to claim 11, wherein the first color sub-pixel and the second color sub-pixel have substantially the same shape and size.

14. The array substrate according to claim 11, wherein the first color sub-pixel and the second color sub-pixel are a red sub-pixel and a green sub-pixel, respectively, and the third color sub-pixel is a blue sub-pixel.

15. The array substrate according to claim 1, wherein the plurality of sub-pixel groups comprise a first sub-pixel group and a second sub-pixel group which are alternately arranged along the first direction, and an arrangement order of a row in which the first color sub-pixel and the second color sub-pixel are located and a row in which the third color sub-pixel is located along the second direction in the first pixel group is opposite to an arrangement order of a row in which the first color sub-pixel and the second color sub-pixel are located and a row in which the third color sub-pixel is located along the second direction in the second pixel group.

16. The array substrate according to claim 15, wherein each color sub-pixel in each of the plurality of sub-pixel groups has the same shape and size, and the first color sub-pixel, the second color sub-pixel and the third color sub-pixel are a red sub-pixel, a green sub-pixel and a blue sub-pixel, respectively.

17. A display device, comprising the array substrate according to claim 1.

18. The display device according to claim 17, wherein a resolution of the display device is 8k.

19. An array substrate, comprising:

a plurality of sub-pixel groups arranged in an array along a first direction and a second direction, at least one of the plurality of sub-pixel groups comprising two rows of sub-pixels arranged along the second direction, one row of the two rows of sub-pixels comprising a first color sub-pixel and a second color sub-pixel, and the other row of the two rows of sub-pixels comprising a third color sub-pixel; and at least one data line, wherein the first color sub-pixel, the second color sub-pixel and the third color sub-pixel in each of the plurality of sub-pixel groups are connected to a same date line of the at least one data line;

a first portion of the data line extending along the second direction passes through a gap between the first color sub-pixel and the second color sub-pixel which are connected to the first portion of the data line in the sub-pixel group, and a second portion of the data line bypasses an edge of the third color sub-pixel from a first side of the third color sub-pixel to a second side of the third color sub-pixel, the first side and the second side are respectively located on both sides of a center line of the third color sub-pixel extending along the first direction.

20. An array substrate, comprising:

a plurality of sub-pixel groups arranged in an array along a first direction and a second direction, at least one of the plurality of sub-pixel groups comprising two rows of sub-pixels arranged along the second direction, one row of the two rows of sub-pixels comprising a first color sub-pixel and a second color sub-pixel, and the other row of the two rows of sub-pixels comprising a third color sub-pixel; and at least one data line, wherein the first color sub-pixel, the second color sub-pixel and the third color sub-pixel in each of the plurality of sub-pixel groups are connected to a same date line of the at least one data line;

the plurality of sub-pixel groups comprise a first sub-pixel group and a second sub-pixel group which are alternately arranged along the first direction, and an arrangement order of a row in which the first color sub-pixel and the second color sub-pixel are located and a row in which the third color sub-pixel is located along the second direction in the first pixel group is opposite to an arrangement order of a row in which the first color sub-pixel and the second color sub-pixel are located and a row in which the third color sub-pixel is located along the second direction in the second pixel group.

* * * * *